US012808907B2

(12) United States Patent
Khenkin et al.

(10) Patent No.: US 12,808,907 B2
(45) Date of Patent: Nov. 24, 2026

(54) SYSTEMS AND METHODS FOR MEASURING A CURRENT USING A METAL TRACE

(71) Applicant: Cirrus Logic International Semiconductor Ltd., Edinburgh (GB)

(72) Inventors: Aleksey Khenkin, Lago Vista, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 78 days.

(21) Appl. No.: 19/014,626

(22) Filed: Jan. 9, 2025

(65) Prior Publication Data

US 2025/0306065 A1 Oct. 2, 2025

Related U.S. Application Data

(60) Provisional application No. 63/571,042, filed on Mar. 28, 2024.

(51) Int. Cl.

| | |
|---|---|
| ***G01R 19/32*** | (2006.01) |
| ***G01R 1/20*** | (2006.01) |
| ***G01R 1/30*** | (2006.01) |
| ***G01R 31/40*** | (2020.01) |
| ***G01R 35/00*** | (2006.01) |
| ***H05K 1/16*** | (2006.01) |

(52) U.S. Cl.

CPC ........... *G01R 19/32* (2013.01); *G01R 35/005* (2013.01); *H05K 1/167* (2013.01); *H05K 2201/09227* (2013.01)

(58) Field of Classification Search

CPC .......... G01R 19/32; G01R 35/00; G01R 1/20; G01R 1/30; G01R 31/40; H05K 1/16

See application file for complete search history.

(56) References Cited

U.S. PATENT DOCUMENTS 7,683,604 B1 * 3/2010 Steele ...................... G01R 1/30 324/123 R
2018/0321287 A1 11/2018 Trichy
2024/0133932 A1 4/2024 Ausserlechner

FOREIGN PATENT DOCUMENTS

WO WO-2018168981 A1 * 9/2018 ............ G01R 19/32

OTHER PUBLICATIONS

Search Report under Section 17, UKIPO, Application No. GB2503078.4, dated Aug. 11, 2025.

* cited by examiner

*Primary Examiner* — Neel D Shah

(74) *Attorney, Agent, or Firm* — Jackson Walker L.L.P.

(57) ABSTRACT

A system for measuring a current may include a current sensing component, a metal trace in close proximity to the current sensing component and thermally coupled to the current sensing component, and processing circuitry configured to sense a first voltage drop across the current sensing component, sense a second voltage drop across the metal trace, based on the second voltage drop, estimate a resistance of the current sensing component, and based on the first voltage drop and the resistance, estimate the current.

40 Claims, 8 Drawing Sheets

SYSTEMS AND METHODS FOR MEASURING A CURRENT USING A METAL TRACE

RELATED APPLICATION

The present disclosure claims priority to U.S. Provisional Patent Application No. 63/571,042, filed Mar. 28, 2024, which is incorporated by reference herein in its entirety.

FIELD OF THE INVENTION

The present disclosure relates to systems and methods for measuring an electrical current, and in particular to systems and methods for measuring an electrical current using a metal trace (e.g., a metal trace on a printed circuit board), including determining and compensating for a change in impedance of the metal trace with temperature.

BACKGROUND

It is often desirable to monitor the current flowing in an electronic circuit, for example to determine or estimate the power consumption of the circuit. A typical approach for monitoring current is to use current monitoring circuitry of the kind illustrated in FIG. 1.

Current monitoring circuitry 100 may include a current sense resistor 110 in a signal path in which current is to be monitored. In the example illustrated in FIG. 1, current sense resistor 110 may be provided in a signal path between a supply voltage Vin and some downstream circuitry 120 that is powered by the supply voltage Vin.

Current monitoring circuitry 100 may further comprise processing circuitry 160, which in the example of FIG. 1 may include differential amplifier 130 having a first input coupled to a first node 112 of current sense resistor 110, at which the supply voltage Vin may be received. A second input of differential amplifier 130 may be coupled to a second node 114 of current sense resistor 110, which may be coupled to downstream circuitry 120 to supply a voltage Vout to downstream circuitry 120.

Differential amplifier 130 may output an analog voltage signal that represents a voltage drop across current sense resistor 110 (i.e., the difference between Vout and Vin) to analog-to-digital converter (ADC) 140. ADC 140 may output a digital signal indicative of the voltage drop across current sense resistor 110 to digital signal processor (DSP) 150. DSP circuitry 150 may be configured to determine and output a signal Imon indicative of the current through current sense resistor 110 based on the digital signal indicative of the voltage drop across current sense resistor 110 and a nominal resistance value of current sense resistor 110, in accordance with Ohm's law (e.g., electrical current equal to measured voltage divided by the nominal resistance).

In many current monitoring applications, an accurate and precise measurement of current is needed, for example in power control systems in which a load and/or a charging current (e.g., for a battery) is to be monitored. Accordingly, a current sense resistor (e.g., current sense resistor 110) used to measure current must typically be precise with minimal variation in its resistance due to environmental factors, such as temperature. Thus, current sense resistors are often made from special alloys with very low temperature coefficients and are often large in size and/or expensive in cost. Therefore, alternatives to sensing current with discrete, specialized current resistors may be desirable.

SUMMARY

In accordance with the teachings of the present disclosure, one or more disadvantages and problems associated with traditional approaches for monitoring current may be reduced or eliminated.

In accordance with embodiments of the present disclosure, a system for measuring a current may include a current sensing component, a metal trace in close proximity to the current sensing component and thermally coupled to the current sensing component, and processing circuitry configured to sense a first voltage drop across the current sensing component, sense a second voltage drop across the metal trace, based on the second voltage drop, estimate a resistance of the current sensing component, and based on the first voltage drop and the resistance, estimate the current.

In accordance with these and other embodiments of the present disclosure, a method for measuring a current may include sensing a first voltage drop across a current sensing component, sensing a second voltage drop across a metal trace in close proximity to the current sensing component and thermally coupled to the current sensing component, based on the second voltage drop, estimating a resistance of the current sensing component, and based on the first voltage drop and the resistance, estimating the current.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
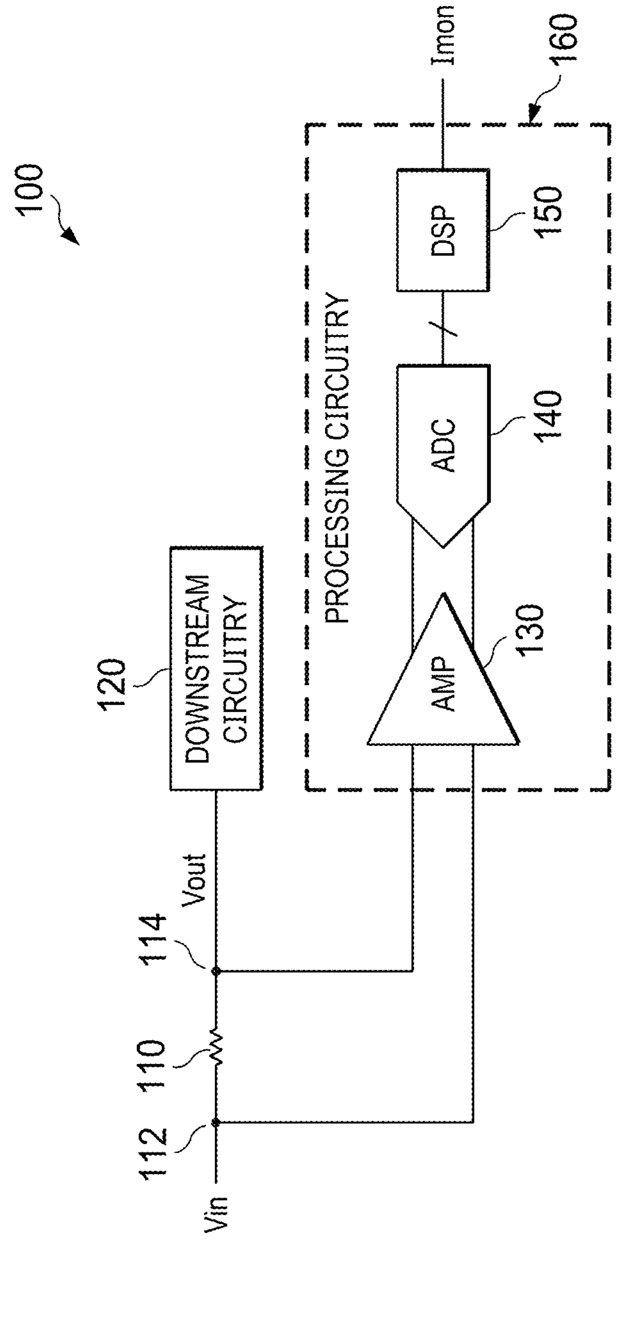
FIG. 1 (PRIOR ART)
FIG. 1 illustrates a schematic diagram illustrating example current monitoring circuitry, as is known in the art.
Figure 2A:
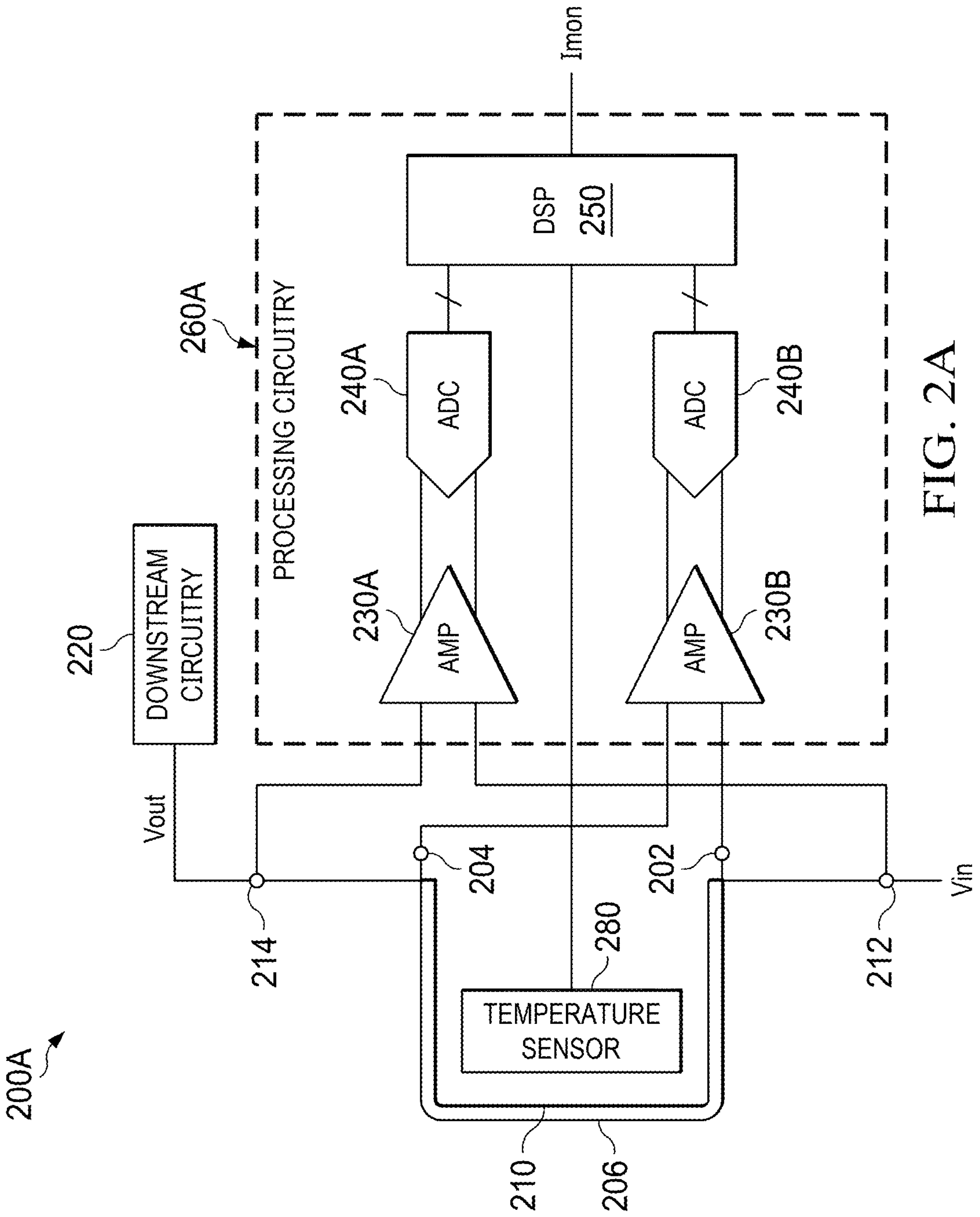
FIG. 2A illustrates a schematic diagram illustrating example current monitoring circuitry, in accordance with embodiments of the present disclosure.

FIG. 2A is a schematic diagram illustrating example current monitoring circuitry 200A, in accordance with embodiments of the present disclosure. Current monitoring circuitry 200A may be implemented on a printed circuit board.

As shown in FIG. 2A, current monitoring circuitry 200A may include a current sense trace 210 in a signal path in which current is to be monitored. In the example illustrated in FIG. 2A, current sense trace 210 may be provided in a signal path between a supply voltage Vin and some downstream circuitry 220 that is powered by the supply voltage Vin. In some embodiments, current sense trace 210 may comprise a trace on a surface or within a metal layer of the printed circuit board upon which current monitoring circuitry 200A is implemented. Accordingly, current sense trace 210 may comprise copper or another highly electrically conductive material.

In addition, as shown in FIG. 2A, current monitoring circuitry 200A may include a temperature sense trace 206 having a known/calibrated resistance value and physically located within close proximity to current sense trace 210. In some embodiments, temperature sense trace 206 may be thermally coupled to current sense trace 210, such that a temperature of temperature sense trace 206 closely approximates a temperature of current sense trace 210. In some embodiments, temperature sense trace 206 may comprise a trace on a surface or within a metal layer of the printed circuit board upon which current monitoring circuitry 200A is implemented. Accordingly, temperature sense trace 206 may comprise copper or another highly electrically conductive material. In fact, in order to better track and compensate for the temperature of current sense trace 210, temperature sense trace 206 may comprise the same material as current sense trace 210.

Current monitoring circuitry 200A may further comprise processing circuitry 260A, which in the example of FIG. 2A may include differential amplifier 230A having a first input coupled to a first node 212 of current sense trace 210, at which the supply voltage Vin may be received. A second input of differential amplifier 230A may be coupled to a second node 214 of current sense trace 210, which may be coupled to downstream circuitry 220 to supply a voltage Vout to downstream circuitry 220.

Differential amplifier 230A may output an analog voltage signal that represents a voltage drop across current sense trace 210 (i.e., the difference between Vout and Vin) to analog-to-digital converter (ADC) 240A. ADC 240A may output a digital signal indicative of the voltage drop across the current sense trace 210 to digital signal processor (DSP) 250.

As also shown in FIG. 2A, processing circuitry 260A may also include differential amplifier 230B having a first input coupled to a first node 202 of temperature sense trace 206. A second input of differential amplifier 230B may be coupled to a second node 204 of temperature sense trace 206.

DSP circuitry 250 may be configured to determine and output a signal Imon indicative of the current through the current sense trace 210 based on the digital signal indicative of the voltage drop across current sense trace 210 and a resistance value of current sense trace 210, in accordance with Ohm's law (e.g., electrical current equal to measured voltage divided by the nominal resistance). The resistance value of current sense trace 210 may be calibrated at a known temperature either during production or in-situ during operation of current monitoring circuitry 200A. Notably, the functionality of current sense trace 210 in current monitoring circuitry 200A is analogous to that of a current sense resistor (e.g., current sense resistor 110) used in traditional approaches. However, unlike current sense resistors that may typically be used in such traditional approaches (e.g., which may not vary significantly in resistance with changes in temperature), materials such as copper used in printed circuit boards may have relatively high thermal coefficients of resistance, such that the resistance value of current sense trace 210 may be expected to vary significantly in response to changes in temperature.

To compensate for changes in such resistance value of current sense trace 210 in response to variation in temperature, DSP 250 may also determine and output signal Imon further based on the digital signal indicative of the voltage drop across temperature sense trace 206 (i.e., in addition to the other factors described above), as the variance in the resistance of temperature sense trace 206 in response to variation in temperature should be expected to be approximately proportional to the variance in the resistance of current sense trace 210 in response to variation in temperature.

In some embodiments, although not explicitly depicted in FIG. 2A, processing circuitry 260A or another component of current monitoring circuitry 200A may be configured to inject an electrical signal into temperature sense trace 206 to ensure a measurable voltage drop forms across temperature sense trace 206.

In addition, in some embodiments, to provide additional robustness to the temperature compensation scheme for current sense trace 210 described herein, current monitoring circuitry 200A may also include a temperature sensor 280. Temperature sensor 280 may comprise any suitable system, device, or apparatus configured to measure a temperature associated with (e.g., in close proximity to) current sense trace 210 and communicate a signal to DSP 250 indicative of such measured temperature. In embodiments that include temperature sensor 280, DSP 250 may further be configured to determine and output signal Imon based on the temperature sensed by temperature sensor 280 (i.e., in addition to the other factors described above), wherein such temperature may be indicative of a variance of the resistance value of current sense trace 210 in response to variations in temperature.

In some embodiments, in addition to the functionality for DSP 250 described above, DSP 250 may also be configured to use thermal modelling of the heat transfer characteristics between current sense trace 210 and temperature sense trace 206 in order to enhance sensing accuracy, as may be particularly useful for fast-changing load currents delivered from input voltage Vin to downstream circuitry, which may cause the temperature of temperature sense trace 206 to lag in tracking changes in the temperature of current sense trace 210.

Figure 2B:
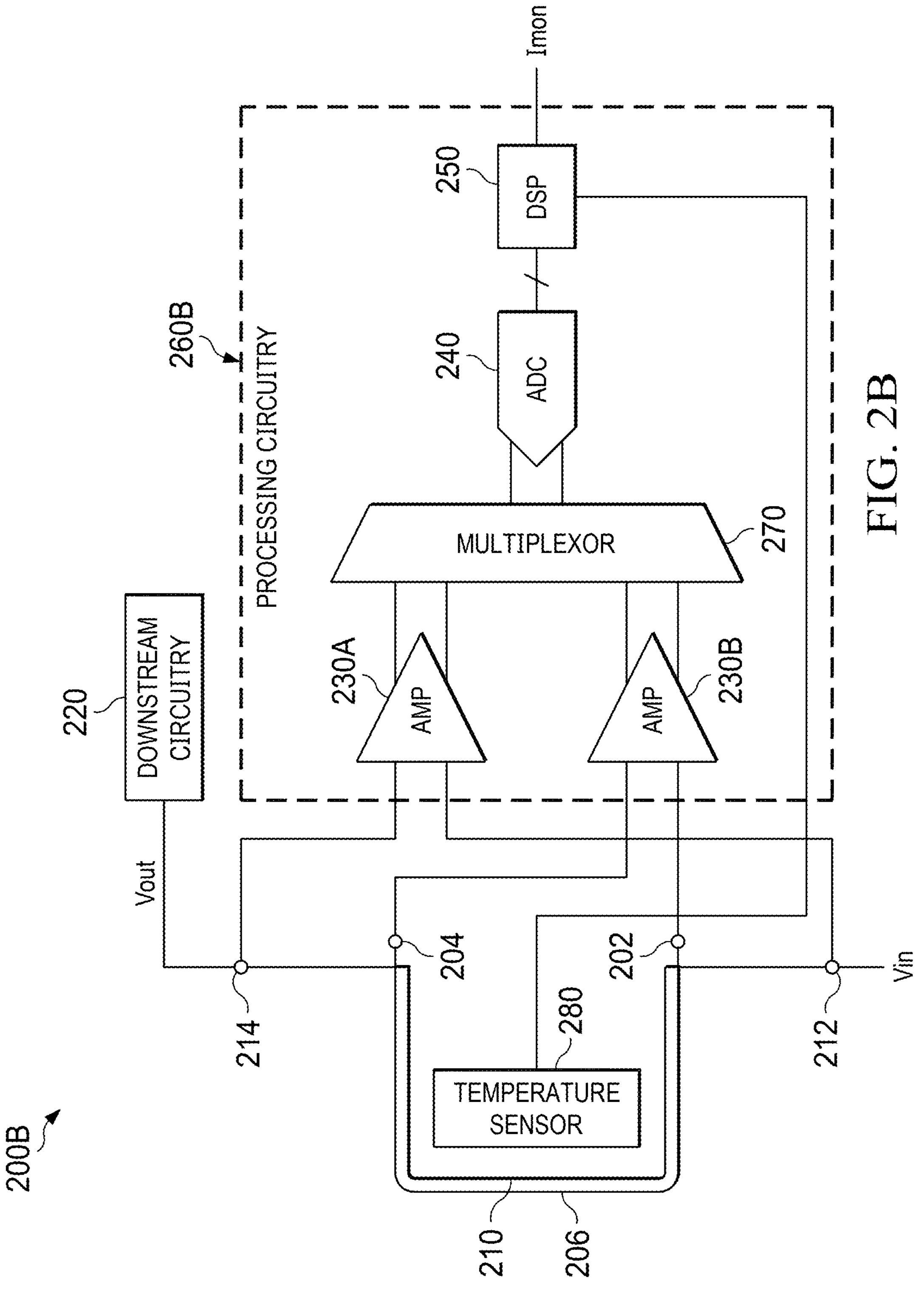
FIG. 2B illustrates a schematic diagram illustrating example current monitoring circuitry, in accordance with embodiments of the present disclosure.

FIG. 2B is a schematic diagram illustrating example current monitoring circuitry 200B, in accordance with embodiments of the present disclosure. Current monitoring circuitry 200B may be similar in many respects to current monitoring circuitry 200A of FIG. 2A, and thus only certain differences between current monitoring circuitry 200A and current monitoring circuitry 200B may be discussed below. In particular, processing circuitry 260B of current monitoring circuitry 200B may be similar to processing circuitry 260A of current monitoring circuitry 200A, with the exception that processing circuitry 260B may include a single ADC 240 (in lieu of ADCs 240A and 240B of monitoring circuitry) and a multiplexer 270 interfaced between differential amplifiers 230A and 230B on the one hand and ADC 240 on the other hand. Multiplexer 270 may comprise any system, device, or apparatus to select between the outputs of amplifiers 230A and 230B, and may pass the selected output as the output of multiplexer 270 to ADC 240. Thus, the presence of multiplexer 270 may allow for processing using a single ADC 240 (e.g., via time-division multiplexing), which may minimize circuit size and cost.

In some embodiments, the approach of current monitoring circuitry 200B, in which a multiplexer or switching circuitry similar in functionality to multiplexer 270 may be interfaced between current sense trace 210 and temperature sense trace 206 on one hand and the input terminals of a single differential amplifier 230 (i.e., in lieu of differential amplifiers 230) on the other hand, may be used to potentially minimize circuit size and cost by enabling the processing of the paths of both current sense trace 210 and temperature sense trace 206 to share a single amplifier 230 and a single ADC 240.

Current sense trace 210 and temperature sense trace 206 may be formed on any suitable layer of the printed circuit board, may be sized and shaped in any suitable size and shape, and may be arranged relative to each other in any suitable manner. FIGS. 3A-3E illustrate various perspective views of example arrangements for current sense trace 210 and temperature sense trace 206. However, other suitable arrangements other than those depicted in FIGS. 3A-3E may be used. Further, for the purposes of clarity and exposition, FIGS. 3A-3E depict only current sense traces 210 and temperature sense traces 206, and not any other portions of a printed circuit board (e.g., dielectric layers laminated between metal layers) that may actually be present in real-world implementation.

Figure 3A:
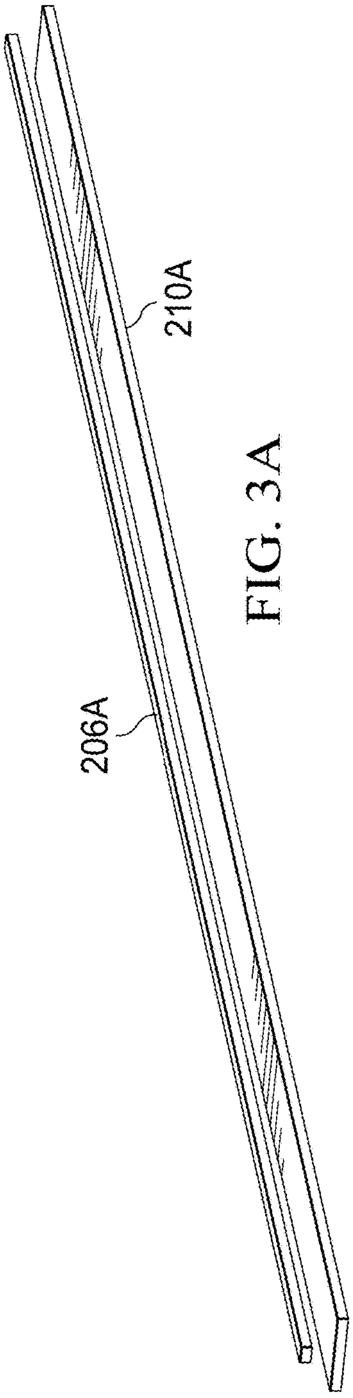
FIG. 3A illustrates an isometric perspective view of a first example embodiment for arranging a current sense trace and a temperature sense trace, in accordance with embodiments of the present disclosure.
Figure 3B:
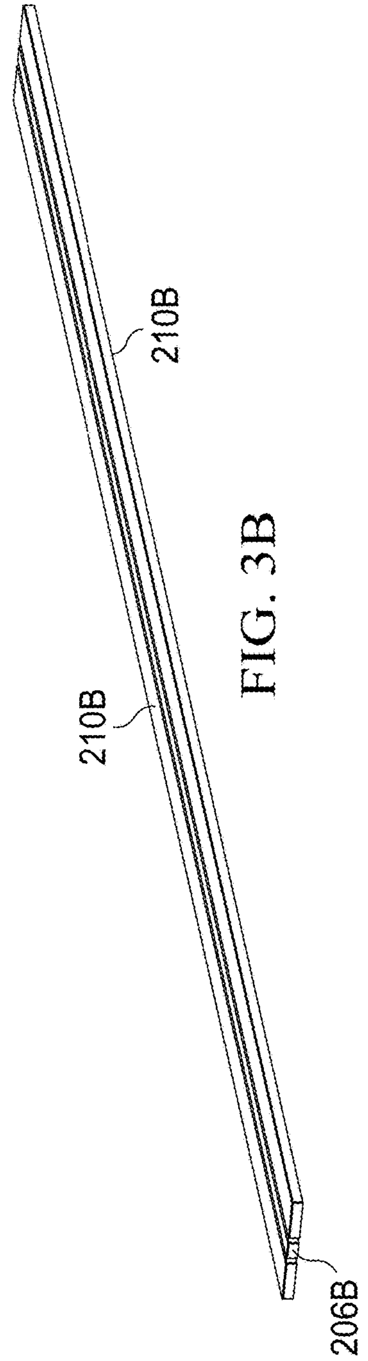
FIG. 3B illustrates an isometric perspective view of a second example embodiment for arranging a current sense trace and a temperature sense trace, in accordance with embodiments of the present disclosure.

For example, in the first example embodiment shown in FIG. 3A, current sense trace 210A and temperature sense trace 206A may be formed on different layers of a printed circuit board. As another example, in the second example embodiment shown in FIG. 3B, current sense trace 210B and temperature sense trace 206B may be formed on the same layer of a printed circuit board. Further, in the second example embodiment shown in FIG. 3B, current sense trace 210B may be implemented by two discrete traces with temperature sense trace 206B running parallel in between the two discrete traces of current sense trace 210B.

Figure 3C:
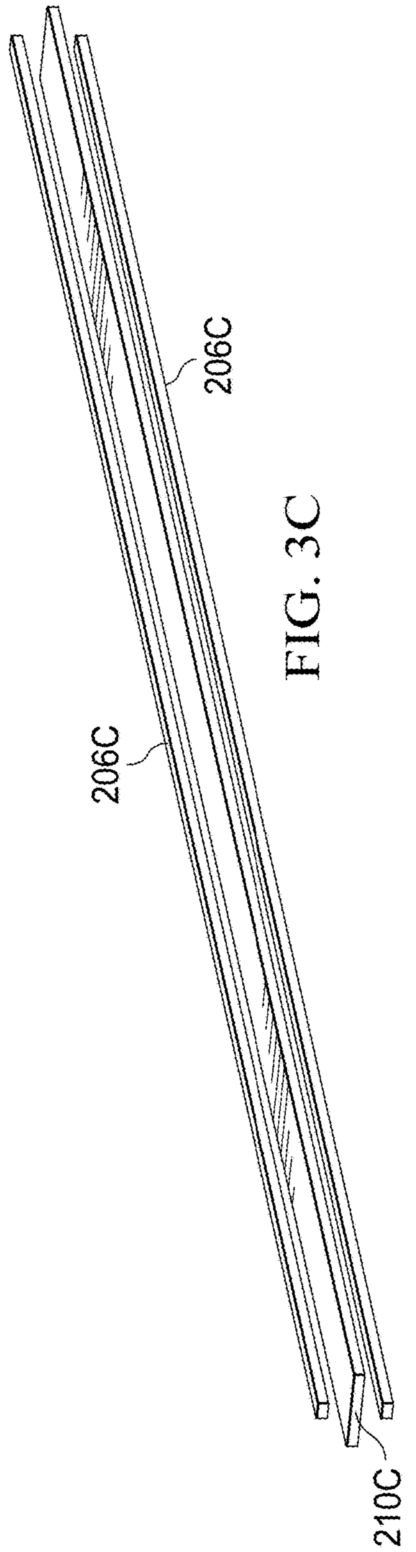
FIG. 3C illustrates an isometric perspective view of a third example embodiment for arranging a current sense trace and a temperature sense trace, in accordance with embodiments of the present disclosure.

As a further example, in the third example embodiment shown in FIG. 3C, temperature sense trace 206C may be implemented with two discrete traces on different layers of a printed circuit board, with current sense trace 210C "sandwiched" between the two discrete traces of temperature sense trace 206C in a third layer between the two layers used between the two discrete traces of temperature sense trace 206C.

Figure 3D:
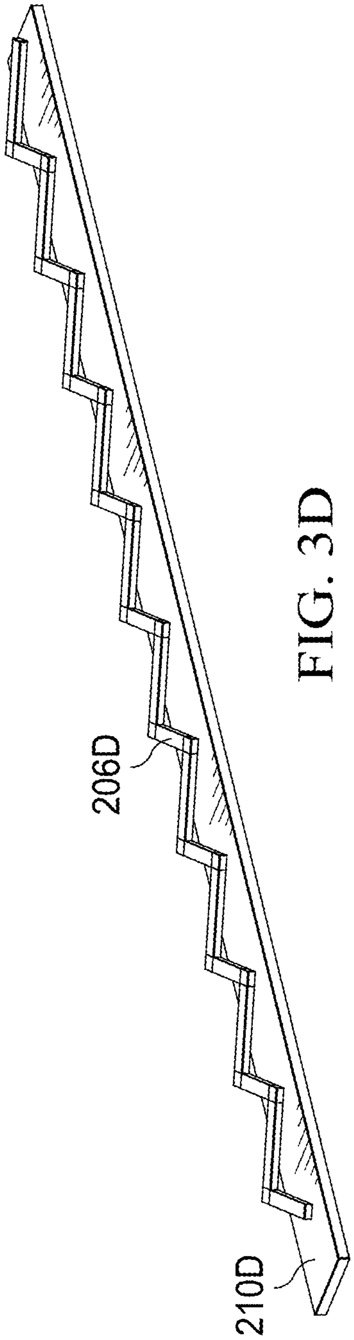
FIG. 3D illustrates an isometric perspective view of a fourth example embodiment for arranging a current sense trace and a temperature sense trace, in accordance with embodiments of the present disclosure.

As an additional example, in the fourth example embodiment shown in FIG. 3D, temperature sense trace 206D may be implemented in a "snaked" or "zig-zag" pattern along the length of current sense trace 210D.

Figure 3E:
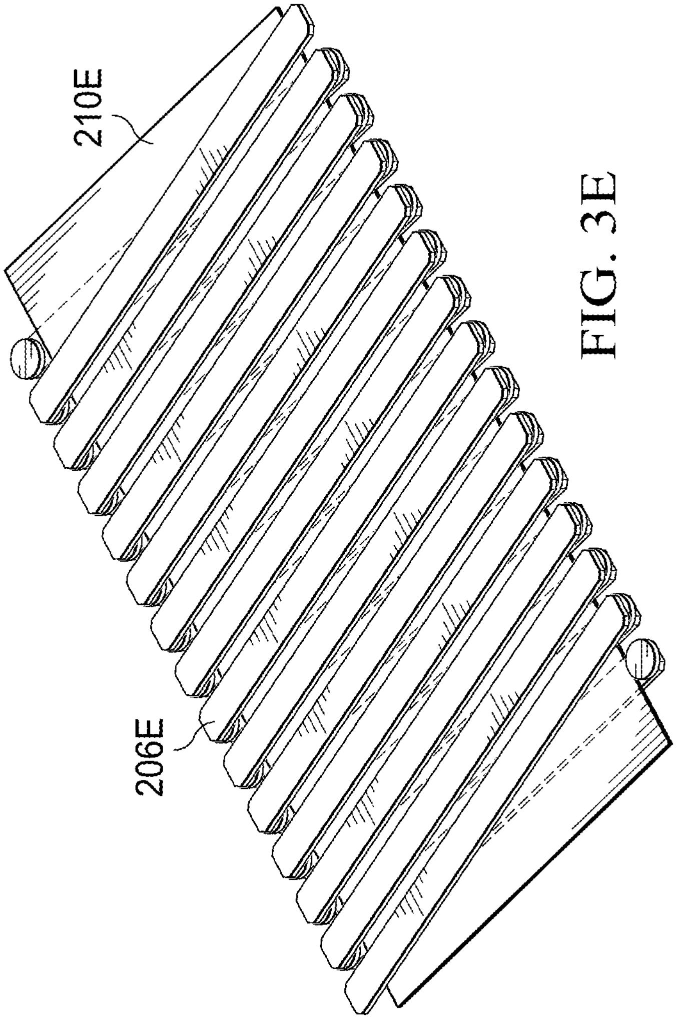
FIG. 3E illustrates an isometric perspective view of a fifth example embodiment for arranging a current sense trace and a temperature sense trace, in accordance with embodiments of the present disclosure.

As yet another example, in the fifth example embodiment shown in FIG. 3E, temperature sense trace 206E may be implemented in a spiral coil around current sense trace 210E along the length of current sense trace 210E.

Regardless of implementation, current sense trace 210 and temperature sense trace 206 may have any suitable shape. For example, for signal quality, transmission purposes, and to limit signal loss, current sense trace 210 may be relatively thick in width throughout its length, while temperature sense trace 206 may be substantially smaller in width throughout its length, to maximize sensitivity of the voltage drop across temperature sense trace 206.

Figure 4:
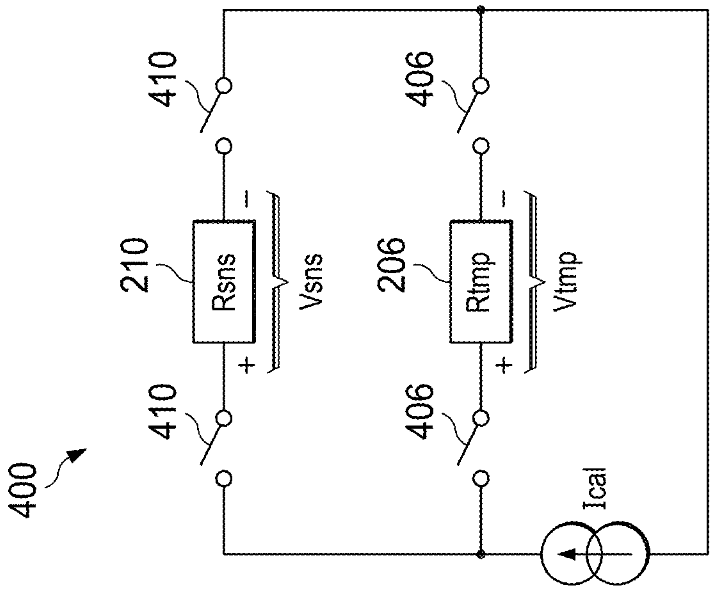
FIG. 4 illustrates a schematic diagram illustrating example current calibration circuitry, in accordance with embodiments of the present disclosure.

FIG. 4 illustrates a schematic diagram illustrating example current calibration circuitry 400, in accordance with embodiments of the present disclosure. In operation, current calibration circuitry 400 may drive a known electrical calibration current Ical through current sense trace 210 when switches 410 of current calibration circuitry 400 are closed (and switches 406 are open) and may drive the same electrical calibration current Ical through temperature sense trace 206 when switches 406 of current calibration circuitry 400 are closed (and switches 410 are open). Such calibration step may enable calculation of a calibration constant relating the resistance value of current sense trace 210 to the measured voltage drop across temperature sense trace 206, as described below.

To illustrate, those of skill in the art will recognize that, pursuant to Ohm's law, during application of electrical calibration current Ical during calibration:

$$Rsns = Vsns/Ical; \text{ and}$$

$$Rtmp = Vtmp/Ical$$

where Rsns is the resistance of current sense trace 210, Vsns is the voltage drop sensed across current sense trace 210, Rtmp is the resistance of temperature sense trace 206, and Vtmp is the voltage drop sensed across temperature sense trace 206.

From the foregoing equations, it is seen that:

$$Rsns = Rtmp \cdot Vsns/Vtmp = (Vtmp/Ical) \cdot (Vsns/Vtmp).$$

Accordingly, the relationship Vsns/Vtmp=Rsns/Rtmp shall hold across all temperatures provided current sense trace 210 and temperature sense trace 206 are formed from the same material (e.g., copper).

During a calibration step, which may be performed at any given temperature, provided that such temperature remains constant during calibration:

$$Rsns\_cal = Vsns\_cal/Ical \text{ (establishing calibration value Rsns\_cal for } Rsns\text{); and}$$

$$Rtmp\_cal = Vtmp\_cal/Ical \text{ (establishing calibration value Rtmp\_cal for } Rtmp\text{)}$$

From these two above equations:

$$Rsns\_cal = (Vtmp\_cal/Ical) \cdot (Vsns\_cal/Vtmp\_cal)$$

and a calibration constant Ccal may be calculated as:

$$Ccal = (Vsns\_cal/Vtmp\_cal) / Ical$$

Calibration constant Ccal may then be used during operation of current monitoring circuitry 200A or current monitoring circuitry 200B (e.g., by DSP 250) to determine a measured resistance Rsns_meas of current sense trace 210 at any temperature, even without knowledge of such temperature, via the equation:

$$Rsns\_meas = Vtmp\_meas \cdot Ccal$$

where Vtmp_meas is a measured value of the voltage drop across temperature sense trace 206. Using such measured resistance Rsns_meas, DSP 250 may then readily calculate current Imon through current sense trace 210 as:

$$Imon = Vsns\_meas/Rsns\_meas$$

where Vsns_meas is a measured value of the voltage drop across current sense trace 210.

Although one advantage of the foregoing systems and methods is to eliminate a discrete current sense resistor for measuring current, in some embodiments, in order to provide greater measurement robustness, current monitoring circuitry (e.g., current monitoring circuitry 200A or 200B), may include a discrete current sense resistor in series with current sense trace 210, wherein processing circuitry (e.g., processing circuitry 260A or 260B) may be configured to also sense a voltage across such discrete current sense resistor, in addition to sensing voltages across temperature sense trace 206 and current sense trace 210, to correct for temperature variations in current sense trace 210.

Figure 5:
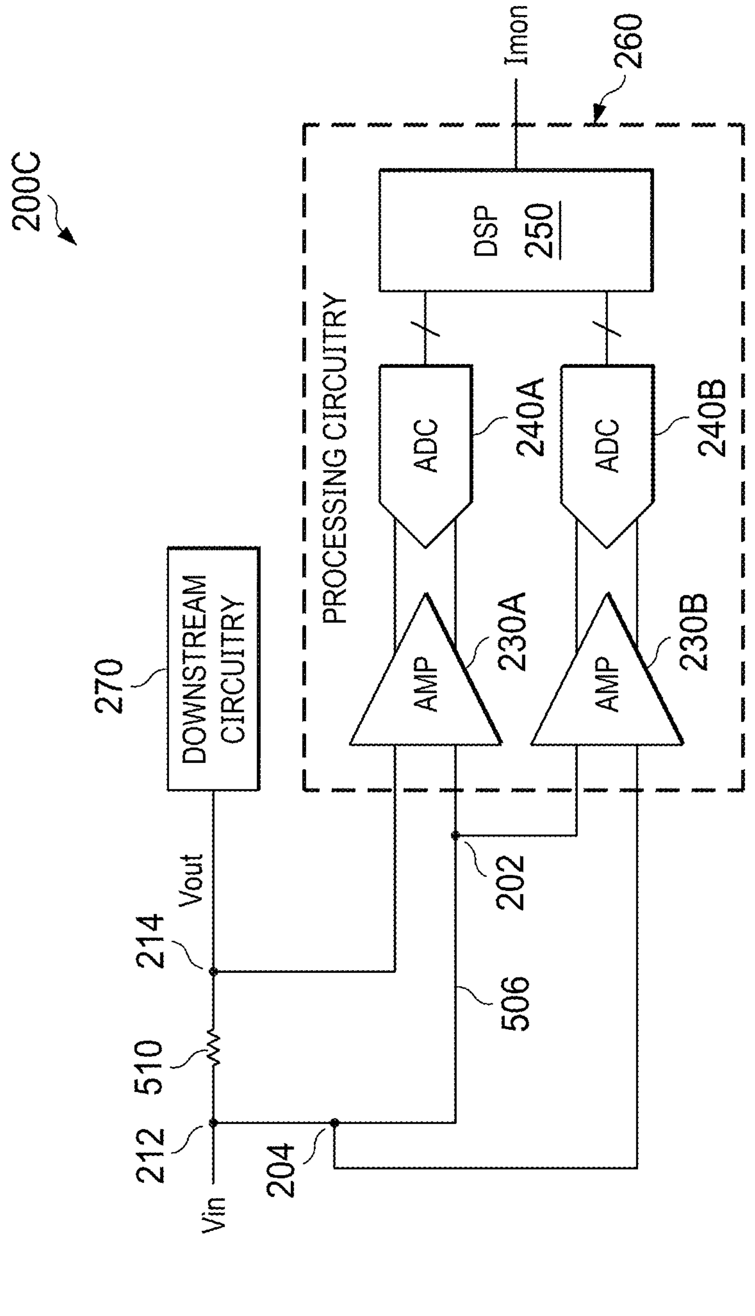
FIG. 5 illustrates a schematic diagram illustrating example current monitoring circuitry, in accordance with embodiments of the present disclosure.

FIG. 5 is a schematic diagram illustrating example current monitoring circuitry 200C, in accordance with embodiments of the present disclosure. Current monitoring circuitry 200C may be similar in many respects to current monitoring circuitry 200A of FIG. 2A, and thus only certain differences between current monitoring circuitry 200A and current monitoring circuitry 200C may be discussed below. In particular, current monitoring circuitry 200C may include a sense resistor 510 in lieu of current sense trace 210, although sense resistor 510 may have functionality similar to that of current sense trace 210. Further, current monitoring circuitry 200C may include a temperature sense trace 506 in lieu of temperature sense trace 206, wherein temperature sense trace 506 is implemented using a portion of the current sensing path between first node 212 of sense resistor 510 and an input to amplifier 230A.

Figure 6:
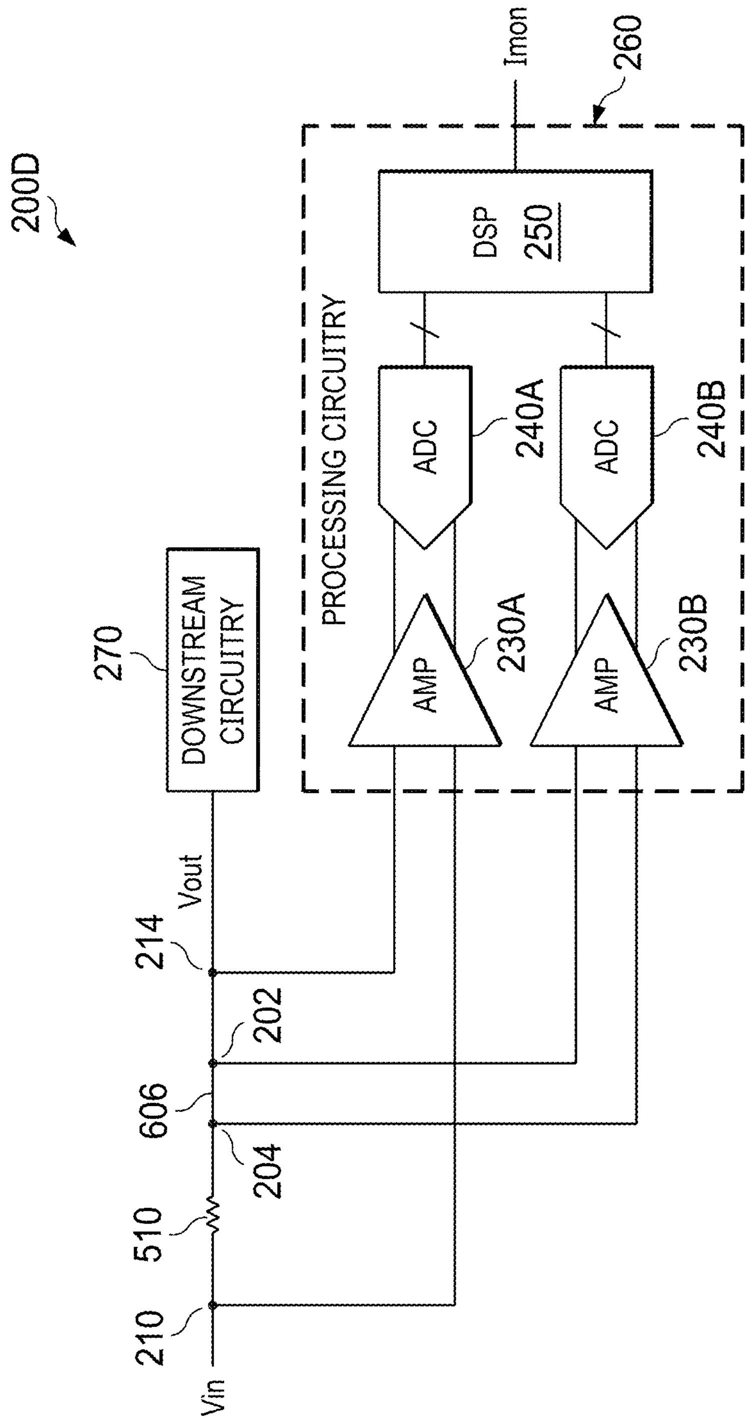
FIG. 6 illustrates a schematic diagram illustrating example current monitoring circuitry, in accordance with embodiments of the present disclosure.

FIG. 6 is a schematic diagram illustrating example current monitoring circuitry 200D, in accordance with embodiments of the present disclosure. Current monitoring circuitry 200D may be similar in many respects to current monitoring circuitry 200C of FIG. 5, and thus only certain differences between current monitoring circuitry 200C and current monitoring circuitry 200D may be discussed below. In particular, current monitoring circuitry 200D may include, in lieu of temperature sense trace 506, a temperature sense trace 606 in series with sense resistor 510.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances, the device could be an accessory device such as a headset, headphones, earphones, earbuds or the like to be used with some other product. In some instances, the device could be a gaming device such as a games console, or a virtual reality (VR) or augmented reality (AR) device such as a VR or AR headset, spectacles or the like.

The skilled person will recognize that some aspects of the above-described apparatus and methods, for example the discovery and configuration methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. A system for measuring a current comprising:
- a current sensing component;
- a metal trace in close proximity to the current sensing component and thermally coupled to the current sensing component; and
- processing circuitry configured to:
  - sense a first voltage drop across the current sensing component;
  - sense a second voltage drop across the metal trace;
  - based on the second voltage drop, estimate a resistance of the current sensing component; and
  - based on the first voltage drop and the resistance, estimate the current.

2. The system of claim 1, further comprising a temperature sensor in close proximity to the current sensing component and thermally coupled to the current sensing component, wherein the processing circuitry is further configured to estimate the current based on the first voltage drop, the resistance, and a temperature measured by the temperature sensor.

3. The system of claim 1, wherein the processing circuitry is further configured to perform a calibration procedure, the calibration procedure comprising:
- driving a known calibration current to the current sensing component;
- sensing the first voltage drop in response to the known calibration current;
- driving the known calibration current to the metal trace;
- sensing the second voltage drop in response to the known calibration current; and
- determining a calibration constant based on the known calibration current, the first voltage drop in response to the known calibration current, and the second voltage drop in response to the known calibration current, wherein the calibration constant defines a relationship between the resistance of the current sensing component and the second voltage drop.

4. The system of claim 3, wherein the calibration constant is approximately equal to the first voltage drop in response to the known calibration current divided by the second voltage drop in response to the known calibration current, such quantity further divided by the known calibration current.

5. The system of claim 4, wherein the resistance of the current sensing component is approximately equal to the second voltage drop multiplied by the calibration constant.

6. The system of claim 1, wherein the current sensing component is a second metal trace.

7. The system of claim 6, wherein the metal trace and the second metal trace comprise the same material.

8. The system of claim 6, wherein the metal trace and the second metal trace comprise copper.

9. The system of claim 6, wherein the metal trace and the second metal trace are traces formed on a printed circuit board.

10. The system of claim 9, wherein:
- the metal trace is formed in a first layer of the printed circuit board; and
- the second metal trace is formed in a second layer of the printed circuit board.

11. The system of claim 9, wherein the metal trace and the second metal trace are formed on the same layer of the printed circuit board.

12. The system of claim 9, wherein the second metal trace is implemented using a plurality of discrete metal traces.

13. The system of claim 9, wherein the metal trace is implemented using a plurality of discrete metal traces.

14. The system of claim 13, wherein:
- the plurality of discrete metal traces of the metal trace comprises:
  - a first discrete metal trace formed in a first layer of the printed circuit board; and
  - a second discrete metal trace formed in a second layer of the printed circuit board; and
- the second metal trace is formed in a third layer of the printed circuit board located between the first layer and the second layer.

15. The system of claim 9, wherein the metal trace is implemented in multiple sections in a zig-zag pattern along a length of the second metal trace.

16. The system of claim 9, wherein the metal trace forms a spiral shape around the second metal trace.

17. The system of claim 1, wherein the processing circuitry is further configured to use thermal modelling of heat transfer characteristics between the current sensing component and the metal trace to compensate for differences in temperature between the current sensing component and the metal trace when estimating the current.

18. The system of claim 1, wherein the current sensing component comprises a discrete current sense resistor.

19. The system of claim 18, wherein the metal trace is electrically in series with the discrete current sense resistor.

20. The system of claim 18, wherein the metal trace comprises a trace of electrically-conductive material coupled between an electrical node of the discrete current sense resistor and the processing circuitry.

21. A method for measuring a current comprising:

sensing a first voltage drop across a current sensing component;

sensing a second voltage drop across a metal trace in close proximity to the current sensing component and thermally coupled to the current sensing component;

based on the second voltage drop, estimating a resistance of the current sensing component; and based on the first voltage drop and the resistance, estimating the current.

22. The method of claim 21, further comprising estimating the current based on the first voltage drop, the resistance, and a temperature measured by a temperature sensor in close proximity to the current sensing component and thermally coupled to the current sensing component.

23. The method of claim 21, further comprising performing a calibration procedure, the calibration procedure comprising:

driving a known calibration current to the current sensing component;

sensing the first voltage drop in response to the known calibration current;

driving the known calibration current to the metal trace;

sensing the second voltage drop in response to the known calibration current; and determining a calibration constant based on the known calibration current, the first voltage drop in response to the known calibration current, and the second voltage drop in response to the known calibration current, wherein the calibration constant defines a relationship between the resistance of the current sensing component and the second voltage drop.

24. The method of claim 23, wherein the calibration constant is approximately equal to the first voltage drop in response to the known calibration current divided by the second voltage drop in response to the known calibration current, such quantity further divided by the known calibration current.

25. The method of claim 24, wherein the resistance of the current sensing component is approximately equal to the second voltage drop multiplied by the calibration constant.

26. The method of claim 21, wherein the current sensing component is a second metal trace.

27. The method of claim 26, wherein the metal trace and the second metal trace comprise the same material.

28. The method of claim 26, wherein the metal trace and the second metal trace comprise copper.

29. The method of claim 26, wherein the metal trace and the second metal trace are traces formed on a printed circuit board.

30. The method of claim 29, wherein:

the metal trace is formed in a first layer of the printed circuit board; and the second metal trace is formed in a second layer of the printed circuit board.

31. The method of claim 29, wherein the metal trace and the second metal trace are formed on the same layer of the printed circuit board.

32. The method of claim 29, wherein the second metal trace is implemented using a plurality of discrete metal traces.

33. The method of claim 29, wherein the metal trace is implemented using a plurality of discrete metal traces.

34. The method of claim 33, wherein:

the plurality of discrete metal traces of the metal trace comprises:

a first discrete metal trace formed in a first layer of the printed circuit board; and a second discrete metal trace formed in a second layer of the printed circuit board; and the second metal trace is formed in a third layer of the printed circuit board located between the first layer and the second layer.

35. The method of claim 29, wherein the metal trace is implemented in multiple sections in a zig-zag pattern along a length of the second metal trace.

36. The method of claim 29, wherein the metal trace forms a spiral shape around the second metal trace.

37. The method of claim 21, further comprising using thermal modelling of heat transfer characteristics between the current sensing component and the metal trace to compensate for differences in temperature between the current sensing component and the metal trace when estimating the current.

38. The method of claim 21, wherein the current sensing component comprises a discrete current sense resistor.

39. The method of claim 38, wherein the metal trace is electrically in series with the discrete current sense resistor.

40. The method of claim 38, wherein the metal trace comprises a trace of electrically-conductive material coupled between an electrical node of the discrete current sense resistor and processing circuitry.

* * * * *